US009484414B2

(12) United States Patent
Yamamoto et al.

(10) Patent No.: US 9,484,414 B2
(45) Date of Patent: Nov. 1, 2016

(54) SEMICONDUCTOR DEVICE

(71) Applicant: Sumitomo Electric Industries, Ltd., Osaka-shi (JP)

(72) Inventors: Hirofumi Yamamoto, Osaka (JP); Toru Hiyoshi, Osaka (JP); Shinji Matsukawa, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/443,176

(22) PCT Filed: Dec. 19, 2013

(86) PCT No.: PCT/JP2013/084054
§ 371 (c)(1),
(2) Date: May 15, 2015

(87) PCT Pub. No.: WO2014/122863
PCT Pub. Date: Aug. 14, 2014

(65) Prior Publication Data
US 2015/0372092 A1 Dec. 24, 2015

(30) Foreign Application Priority Data

Feb. 7, 2013 (JP) ................. 2013-022221

(51) Int. Cl.
*H01L 29/00* (2006.01)
*H01L 29/16* (2006.01)
(Continued)

(52) U.S. Cl.
CPC ......... *H01L 29/1608* (2013.01); *H01L 21/049* (2013.01); *H01L 21/28* (2013.01);
(Continued)

(58) Field of Classification Search
CPC ................ H01L 29/7802; H01L 29/66068; H01L 29/1608; H01L 29/0878; H01L 29/45; H01L 29/861; H01L 29/12; H01L 29/7827; H01L 29/045; H01L 29/417; H01L 29/47; H01L 29/872; H01L 29/6606; H01L 29/08; H01L 29/78; H01L 29/1075; H01L 21/045; H01L 21/049; H01L 21/28
See application file for complete search history.

(56) References Cited

U.S. PATENT DOCUMENTS 5,285,103 A * 2/1994 Chen ................. H01L 21/76802
257/408
2004/0159841 A1 8/2004 Hisada et al.
(Continued)

FOREIGN PATENT DOCUMENTS

JP 2004-207511 A 7/2004
JP 2006-148048 A 6/2006
(Continued)

OTHER PUBLICATIONS

International Search Report in PCT International Application No. PCT/JP2013/084054, dated Apr. 8, 2014.
(Continued)

*Primary Examiner* — Eva Y Montalvo
*Assistant Examiner* — Quovaunda V Jefferson
(74) *Attorney, Agent, or Firm* — Venable LLP; Michael A. Sartori; F. Brock Riggs

(57) ABSTRACT

A MOSFET includes a silicon carbide substrate including a main surface having an off angle with respect to a {0001} plane and a source electrode formed in contact with the main surface. A base surface is exposed at at least a part of a contact interface of the silicon carbide substrate with the source electrode. With such a construction, the MOSFET achieves suppressed variation in threshold voltage.

4 Claims, 14 Drawing Sheets

(51) Int. Cl.
| | |
|---|---|
| *H01L 29/417* | (2006.01) |
| *H01L 29/47* | (2006.01) |
| *H01L 29/872* | (2006.01) |
| *H01L 29/66* | (2006.01) |
| *H01L 29/08* | (2006.01) |
| *H01L 21/04* | (2006.01) |
| *H01L 29/78* | (2006.01) |
| *H01L 29/04* | (2006.01) |
| *H01L 21/28* | (2006.01) |
| *H01L 29/12* | (2006.01) |
| *H01L 29/45* | (2006.01) |
| *H01L 29/861* | (2006.01) |
| *H01L 29/10* | (2006.01) |

(52) U.S. Cl.
CPC ............ *H01L 29/045* (2013.01); *H01L 29/08* (2013.01); *H01L 29/12* (2013.01); *H01L 29/417* (2013.01); *H01L 29/45* (2013.01); *H01L 29/47* (2013.01); *H01L 29/6606* (2013.01); *H01L 29/66068* (2013.01); *H01L 29/78* (2013.01); *H01L 29/7802* (2013.01); *H01L 29/7827* (2013.01); *H01L 29/861* (2013.01); *H01L 29/872* (2013.01); *H01L 29/1075* (2013.01)

(56) References Cited

U.S. PATENT DOCUMENTS

| | | | |
|---|---|---|---|
| 2007/0108450 A1* | 5/2007 | O'Loughlin | ............ C30B 25/02 257/77 |
| 2008/0233285 A1* | 9/2008 | Das | ................... H01L 21/02236 427/248.1 |
| 2009/0250705 A1 | 10/2009 | Watanabe et al. | |

FOREIGN PATENT DOCUMENTS

| | | |
|---|---|---|
| JP | 2008-205296 A | 9/2008 |
| JP | 2008-205323 A | 9/2008 |
| JP | 2009-252811 A | 10/2009 |
| JP | 2011-071281 A | 4/2011 |

OTHER PUBLICATIONS

Okamoto et al, "Reduction of instability in $V_{th}$ of 4H-SiC C-face MOSFET's," Proceedings of the 59th Spring Meeting of the Japan Society of Applied Physics and Related Societies, p. 15-309 (2012).
Notice of Grounds of Rejection in Japanese Patent Application No. 2013-022221, dated Jul. 5, 2016.

* cited by examiner

SEMICONDUCTOR DEVICE

TECHNICAL FIELD

The present invention relates to a semiconductor device and more particularly to a semiconductor device achieving suppressed variation in electrical characteristics.

BACKGROUND ART

In order to allow a semiconductor device to be high in breakdown voltage and low in loss, silicon carbide has recently increasingly been adopted as a material forming a semiconductor device. Silicon carbide is a wide band gap semiconductor greater in band gap than silicon which has conventionally widely been used as a material forming a semiconductor device. Therefore, by adopting silicon carbide as a material forming a semiconductor device, a higher breakdown voltage and lowering in ON resistance of a semiconductor device can be achieved. A semiconductor device containing silicon carbide as a material is also advantageous in that lowering in characteristics when it is used in a high temperature environment is less than in a semiconductor device containing silicon as a material.

Examples of a semiconductor device containing silicon carbide as a constituent material include a metal oxide semiconductor field effect transistor (MOSFET) and a Schottky barrier diode (SBD). A MOSFET is a semiconductor device in which a current is allowed or not allowed to pass by controlling whether or not an inversion layer is formed in a channel region with a prescribed threshold voltage being defined as a boundary. This MOSFET is disadvantageous in that a stable operation thereof is not obtained due to variation in threshold voltage, across which a current is allowed or not allowed to pass. In order to address this, for example, reduction of instability in threshold voltage has been proposed by studying a condition for forming a gate oxide film (see, for example, Mitsuo Okamoto et al., "Reduction of Instability in $V_{th}$ of 4H—SiC C-Face MOSFETs," the 59th Spring Meeting, Proceedings, The Japan Society of Applied Physics, March 2012, pp. 15-309 (NPD 1)).

CITATION LIST

Non Patent Document

NPD 1: Mitsuo Okamoto et al., "Reduction of Instability in $V_{th}$ of 4H—SiC C-Face MOSFETs," the 59th Spring Meeting, Proceedings, The Japan Society of Applied Physics, March 2012, pp. 15-309

SUMMARY OF INVENTION

Technical Problem

Though a proposal for suppressing variation in threshold voltage in a MOSFET has been made as described above, no finding about a detailed cause thereof has been obtained. Therefore, it has been difficult in a conventional MOSFET to sufficiently suppress variation in electrical characteristics such as a threshold voltage. Then, an object of the present invention is to provide a semiconductor device achieving sufficiently suppressed variation in electrical characteristics such as a threshold voltage.

Solution to Problem

A semiconductor device according to the present invention includes a silicon carbide substrate including a main surface having an off angle with respect to a {0001} plane and an ohmic electrode formed in contact with the main surface. A base surface is exposed at at least a part of a contact interface of the silicon carbide substrate with the ohmic electrode.

The present inventor has conducted detailed studies about a cause of variation in electrical characteristics such as a threshold voltage in a semiconductor device (such as a MOSFET) having such a construction that an ohmic electrode is formed on a silicon carbide substrate, and consequently, obtained the finding below and derived the present invention.

Initially, in a semiconductor device in which an ohmic electrode is formed on a silicon carbide substrate, before a voltage is applied to the semiconductor device, a clumpy object derived from an electrode material is present around a contact interface between the ohmic electrode and the silicon carbide substrate. After a voltage is applied for a prescribed period of time, the clumpy object disappears. Namely, before and after application of a voltage to the ohmic electrode, a state of distribution of an element (for example, a silicon element in a case that the ohmic electrode is composed of a TiAlSi alloy) at the contact interface between the ohmic electrode and the silicon carbide substrate changes.

The present inventor has paid attention to the fact that such change in state of distribution of an element as described above is the cause of variation in electrical characteristics of the semiconductor device, found a more stable structure at the contact interface between the ohmic electrode and the silicon carbide substrate, and derived the present invention. Namely, in the semiconductor device according to the present invention, a base surface is exposed at at least a part of the contact interface of the silicon carbide substrate with the ohmic electrode. Thus, a structure more stable than in a case that the base surface is not exposed at the contact interface is obtained, and consequently, variation in electrical characteristics is mitigated. Therefore, according to the semiconductor device in the present invention, a semiconductor device achieving sufficiently suppressed variation in electrical characteristics can be provided.

In the semiconductor device above, the ohmic electrode may contain at least one metal of Ni, Ti, and Al. More specifically, the ohmic electrode may be composed of a TiAlSi alloy or an NiSi alloy. Good ohmic contact between the ohmic electrode and the silicon carbide substrate can thus be secured.

In the semiconductor device above, a length of the base surface in a direction of the off angle may be not smaller than 36 nm and not greater than 430 nm. When the length of the base surface is smaller than 36 nm, it is difficult to sufficiently secure a region where the base surface is exposed at the contact interface of the silicon carbide substrate with the ohmic electrode. When the length of the base surface exceeds 430 nm, an electrode material may spike (pass through) an n-type SiC region of the source, which may interfere an operation of the MOSFET. For such reasons, the length of the base surface is preferably not smaller than 36 nm and not greater than 430 nm and further more preferably not smaller than 50 nm and not greater than 143 nm. Variation in electrical characteristics of the semiconductor device can thus further be suppressed.

The semiconductor device above may further include an oxide film formed in contact with the silicon carbide substrate, a gate electrode formed in contact with the oxide film such that the oxide film lies between the gate electrode and the silicon carbide substrate, and a drain electrode formed in contact with the silicon carbide substrate. The ohmic electrode may be a source electrode. The source electrode and the drain electrode may be configured such that a current which flows between the source electrode and the drain electrode can be controlled with a gate voltage applied to the gate electrode. A difference between a first threshold voltage of the semiconductor device which is measured for the first time and a second threshold voltage of the semiconductor device which is measured after application of stress to the semiconductor device continuously for 1000 hours may be within ±0.2 V. Here, application of the stress means application of the gate voltage of −15 V to the gate electrode while a voltage of the source electrode is 0 V and a voltage of the drain electrode is 0 V. A semiconductor device achieving further suppressed variation in threshold voltage can thus be provided.

Here, definition of a threshold voltage will be described with reference to FIGS. 11 and 12. In FIGS. 11 and 12, the abscissa represents a gate voltage ($V_g$) and the ordinate represents a drain current ($I_d$). Referring to FIG. 11, initially, a drain current ($I_d$) is measured with a gate voltage ($V_g$) being varied. Substantially no drain current flows when a gate voltage is negative. As the gate voltage is made higher, the drain current abruptly starts to flow. A threshold voltage ($V_{th}$) refers to a gate voltage at which a drain current starts to flow. More specifically, a threshold voltage ($V_{th}$) refers to a gate voltage at the time when a drain voltage is set to 0.1 V, a source voltage is set to 0 V, and a drain current is set to 1 nA. A voltage across the source and the drain ($V_{ds}$) is set to 0.1 V.

Variation in threshold voltage will now be described with reference to FIG. 12. Initially, a drain current is measured with a gate voltage applied to a semiconductor device being varied. A gate voltage at which a drain current is set to 1 nA is defined as a first threshold voltage ($V_{th1}$). Then, stress is applied to the semiconductor device. Thereafter, a drain current is measured with a gate voltage being varied. Then, a gate voltage at which the drain current is set to 1 nA is defined as a second threshold voltage ($V_{th2}$) A threshold voltage is thus varied as stress is applied.

Normally, after manufacturing of semiconductor devices is completed, operation tests for shipment inspection are conducted and thereafter the semiconductor devices are shipped. In the present invention, a first threshold voltage of a semiconductor device which is measured for the first time includes a case of measurement of a first threshold voltage by applying a voltage to a gate electrode for the first time after shipment of the semiconductor devices.

Advantageous Effects of Invention

As is clear from the description above, according to the semiconductor device in the present invention, a semiconductor device achieving sufficiently suppressed variation in electrical characteristics such as a threshold voltage can be provided.

DESCRIPTION OF EMBODIMENTS

Figure 1:
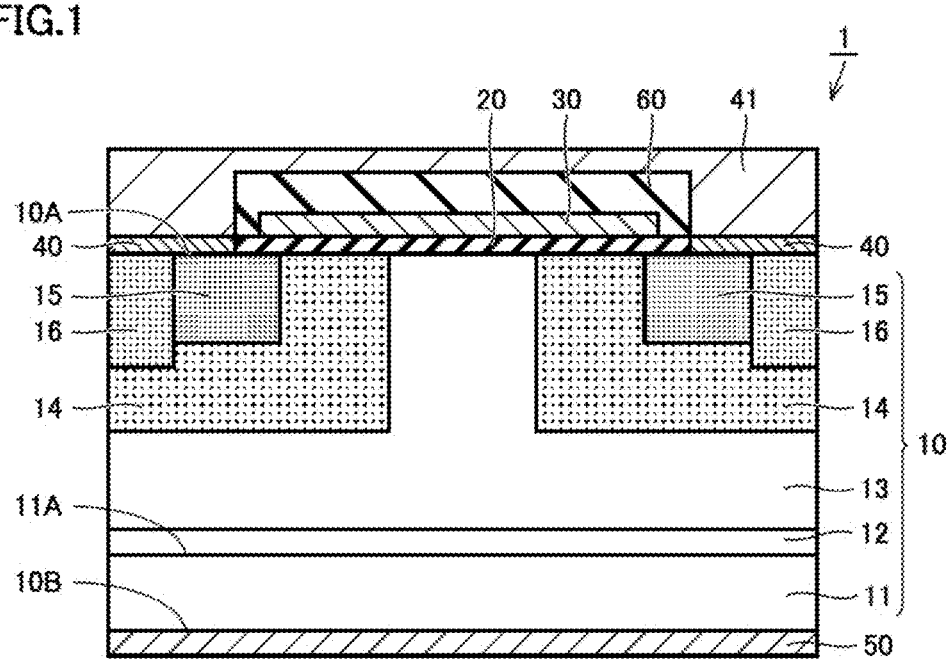
FIG. 1 is a schematic cross-sectional view showing a structure of a MOSFET according to a first embodiment.

An embodiment of the present invention will be described hereinafter with reference to the drawings. In the drawings below, the same or corresponding elements have the same reference characters allotted and description thereof will not be repeated. In crystallographic denotation herein, an individual orientation, a group orientation, an individual plane, and a group plane are shown in [ ], < >, ( ), and { }, respectively. Moreover, a crystallographically negative index is expressed by a number with a bar "-" thereabove, however, a negative sign herein precedes a number.

First Embodiment

A structure of a MOSFET 1 as a semiconductor device according to a first embodiment representing one embodiment of the present invention will initially be described. Referring to FIG. 1, MOSFET 1 is a planar MOSFET and mainly includes a silicon carbide substrate 10, a gate oxide film 20, a gate electrode 30, a source electrode 40 and a drain electrode 50 serving as ohmic electrodes, an interlayer insulating film 60, and a source interconnection 41.

Silicon carbide substrate 10 is composed, for example, of hexagonal silicon carbide having a poly type 4H, and includes a main surface 10A having an off angle with respect to a {0001} plane. Main surface 10A may be, for example, a surface having an off angle not smaller than 0.1° and not greater than 8° with respect to the {0001} plane or may be a surface having an off angle not smaller than 1° and not greater than 8°. Alternatively, main surface 10A may be a surface macroscopically having an off angle of 62°±10° with respect to the {0001} plane, and may specifically be a (03-38) plane.

Silicon carbide substrate 10 includes a base substrate 11 composed of silicon carbide and having an n conductivity type, a buffer layer 12 composed of silicon carbide and having the n conductivity type, a drift layer 13 composed of silicon carbide and having the n conductivity type, a pair of body regions 14 having a p conductivity type, a source region 15 having the n conductivity type, and a contact region 16 having the p conductivity type. Silicon carbide substrate 10 should only be a substrate partially containing silicon carbide and base substrate 11 is not limited to a substrate composed of silicon carbide. Base substrate 11 may be composed, for example, of silicon (Si), gallium nitride (GaN), aluminum nitride (AlN), and a mixed crystal of gallium nitride and aluminum nitride (AlGaN).

Buffer layer 12 is formed on one main surface 11A of base substrate 11 and has the n conductivity type by containing an n-type impurity. Drift layer 13 is formed on buffer layer 12 and has the n conductivity type by containing an n-type impurity. The n-type impurity contained in drift layer 13 is exemplified by nitrogen (N), and contained therein at a concentration (density) lower than that of an n-type impurity contained in buffer layer 12. Buffer layer 12 and drift layer 13 are epitaxially grown layers formed on one main surface 11A of base substrate 11.

The pair of body regions 14 is formed in the epitaxially grown layer as being separate from each other and has the p conductivity type by containing a p-type impurity (an impurity having the p conductivity type). A p-type impurity contained in body region 14 is exemplified by aluminum (Al) or boron (B).

Source region 15 is formed in each of the pair of body regions 14 so as to include main surface 10A and to be surrounded by body region 14. Source region 15 contains an n-type impurity (an impurity having the n conductivity type) such as phosphorus (P) at a concentration (density) higher than that of the n-type impurity contained in drift layer 13.

Contact region 16 is formed in each of the pair of body regions 14 so as to include main surface 10A, to be surrounded by body region 14, and to be adjacent to source region 15. Contact region 16 contains a p-type impurity such as Al at a concentration (density) higher than that of a p-type impurity contained in body region 14.

Gate oxide film 20 is formed on main surface 10A of silicon carbide substrate 10 as being in contact therewith. Gate oxide film 20 is composed, for example, of silicon dioxide, and formed on main surface 10A so as to extend from one source region 15 to the other source region 15.

Gate electrode 30 is formed on gate oxide film 20 as being in contact therewith so as to extend from one source region 15 to the other source region 15. Gate electrode 30 is formed in contact with gate oxide film 20 such that gate oxide film 20 lies between the gate electrode and silicon carbide substrate 10. Gate electrode 30 is formed from polysilicon to which an impurity has been added or such a conductor as Al.

Source electrode 40 is formed on main surface 10A of silicon carbide substrate 10 (on source region 15 and contact region 16) as being in contact therewith. Source electrode 40 is composed, for example, of a TiAlSi (titanium aluminum silicide) alloy or an NiSi (nickel silicide) alloy, and contains silicon (Si) and at least one metal of Ni, Ti, and Al. Good ohmic contact is thus secured between silicon carbide substrate 10 and source electrode 40. A structure of a contact interface between silicon carbide substrate 10 and source electrode 40 will be described in detail later.

Drain electrode 50 is formed on a main surface 10B of silicon carbide substrate 10 which is opposite to main surface 10A, as being in contact therewith. Similarly to source electrode 40, drain electrode 50 is composed of the TiAlSi alloy or the NiSi alloy, and is in ohmic contact with silicon carbide substrate 10. Source electrode 40 and drain electrode 50 are configured such that a current which flows between source electrode 40 and drain electrode 50 ($I_{ds}$) can be controlled with a gate voltage ($V_g$) applied to gate electrode 30.

Interlayer insulating film 60 is composed, for example, of silicon dioxide ($SiO_2$) or silicon nitride (SiN), and formed to surround gate electrode 30 together with gate oxide film 20. Interlayer insulating film 60 has a film thickness, for example, not smaller than 0.5 μm and not greater than 2.0 μm.

Figure 2:
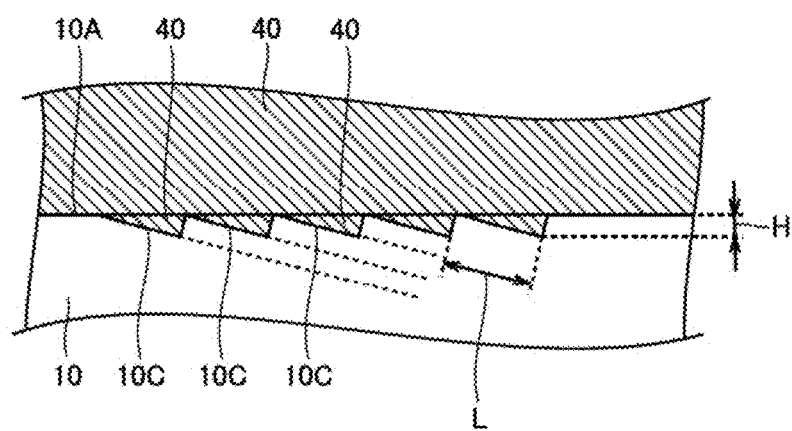
FIG. 2 is a schematic cross-sectional view showing in an enlarged manner, the structure of the MOSFET according to the first embodiment.

A structure of the contact interface between source electrode 40 and silicon carbide substrate 10 will now be described. Referring to FIG. 2, a region where a base surface 10C is exposed is formed in main surface 10A of silicon carbide substrate 10, and contact with source electrode 40 is made in that region. Namely, base surface 10C is exposed at at least a part of the contact interface of silicon carbide substrate 10 with source electrode 40. A plurality of base surfaces 10C are exposed at the contact interface, and contact with source electrode 40 is made at each base surface 10C. Here, when main surface 10A is a surface having an off angle not smaller than 0.10 and not greater than 8° (not smaller than 0.1° and not greater than 8°) with respect to a (0001) plane, base surface 10C is the (0001) plane (a silicon face). When main surface 10A is a surface having an off angle not smaller than 0.1° and not greater than 8° (not smaller than 1° and not greater than 8°) with respect to a (000-1) plane, base surface 10C is (000-1) (a carbon face). When main surface 10A is a (03-38) plane, base surface 10C is a (01-12) plane. With such a structure, MOSFET 1 according to the present embodiment achieves suppressed variation in threshold voltage as will be described later.

Referring to FIG. 2, a length L of base surface 10C in a direction of an off angle may be, for example, not smaller than 36 nm and not greater than 430 nm. When length L of base surface 10C is smaller than 36 nm, it is difficult to sufficiently secure a region where base surface 10C is exposed at the contact interface of silicon carbide substrate 10 with source electrode 40. When length L of base surface 10C exceeds 430 nm, an electrode material may spike n-type SiC (source region 15). For such reasons, length L of the base surface is preferably not smaller than 36 nm and not greater than 430 nm, so that variation in threshold voltage of MOSFET 1 can further be suppressed. Here, "length L of base surface 10C in a direction of an off angle" refers to a length of base surface 10C in an off direction of base surface 10C with respect to main surface 10A. When length L of base surface 10C is not smaller than 36 nm and not greater than 430 nm, a height H is not smaller than 5 nm and not greater than 15 nm. Length L of base surface 10C is preferably not smaller than 36 nm and not greater than 430 nm and further preferably not smaller than 50 nm and not greater than 143 nm.

A state of exposure of base surface 10C as shown in FIG. 2 can be confirmed by observing a cross-sectional structure of MOSFET 1, for example, with energy dispersive X-ray spectrometry (EDX), bright field (BF)-scanning transmission electron microscopy (STEM), or high-angle annular dark-field (HAADF)-STEM. In MOSFET 1 in the present embodiment, a structure as shown in FIG. 2 may be formed not only at the contact interface between source electrode 40 and silicon carbide substrate 10 but also at a contact interface between drain electrode 50 and silicon carbide substrate 10.

An operation of MOSFET 1 will now be described. Referring to FIG. 1, when a voltage of gate electrode 30 is lower than a threshold voltage (that is, in an off state), a pn junction between body region 14 and drift layer 13 located directly under gate oxide film 20 is reverse-biased even though a voltage is applied to drain electrode 50, and a non-conducting state is established. When a voltage not lower than the threshold voltage is applied to gate electrode 30, an inversion layer is formed in a channel region around a portion of contact between body region 14 and gate oxide film 20. Consequently, source region 15 and drift layer 13 are electrically connected to each other and a current flows between source electrode 40 and drain electrode 50.

Suppression of variation in threshold voltage of MOSFET 1 can be confirmed as follows. Namely, a difference between a first threshold voltage ($V_{th1}$) of MOSFET 1 which is measured for the first time for MOSFET 1 and a second threshold voltage ($V_{th2}$) of MOSFET 1 which is measured after application of stress to MOSFET 1 continuously for 1000 hours is within ±0.2 V. Here, application of stress means application of a gate voltage of −15 V to gate electrode 30 while a source voltage of source electrode 40 is 0 V and a drain voltage of drain electrode 50 is 0 V.

More preferably, a difference between the first threshold voltage ($V_{th1}$) and a third threshold voltage ($V_{th3}$) measured after lapse of any time period up to 1000 hours after application of stress to MOSFET 1 is within ±0.2 V. Stress may be applied to MOSFET 1, for example, at a room temperature or at a temperature of 150° C. Preferably, at whichever temperature of the room temperature and 150° C. stress may be applied, a difference between the first threshold voltage ($V_{th1}$) and the second threshold voltage ($V_{th2}$) is within ±0.2 V.

Figure 3:
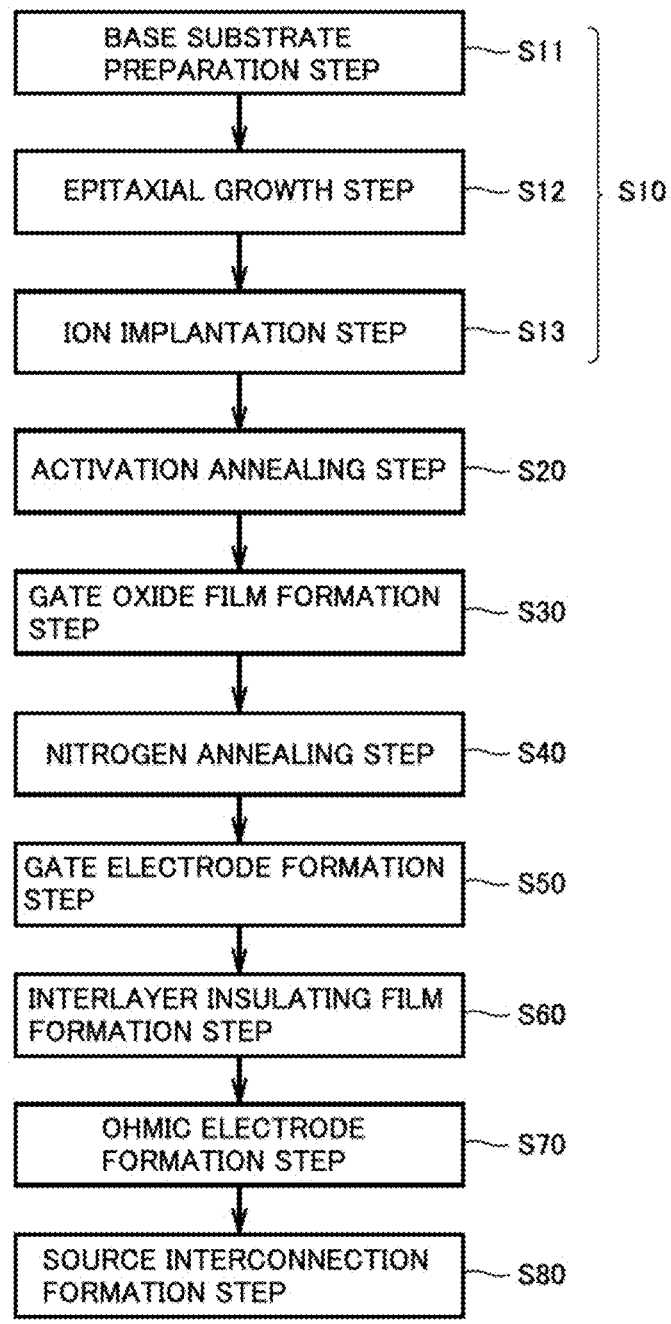
FIG. 3 is a flowchart schematically showing a method of manufacturing a semiconductor device according to the first embodiment.

A method of manufacturing a semiconductor device according to the present embodiment will now be described. In the method of manufacturing a semiconductor device according to the present embodiment, MOSFET 1 according to the present embodiment is manufactured. Referring to FIG. 3, in the method of manufacturing a semiconductor device according to the present embodiment, initially, in a step (S10), a silicon carbide substrate preparation step is performed. In this step (S10), a base substrate preparation step (S11), an epitaxial growth step (S12), and an ion implantation step (S13) are successively performed.

Figure 4:
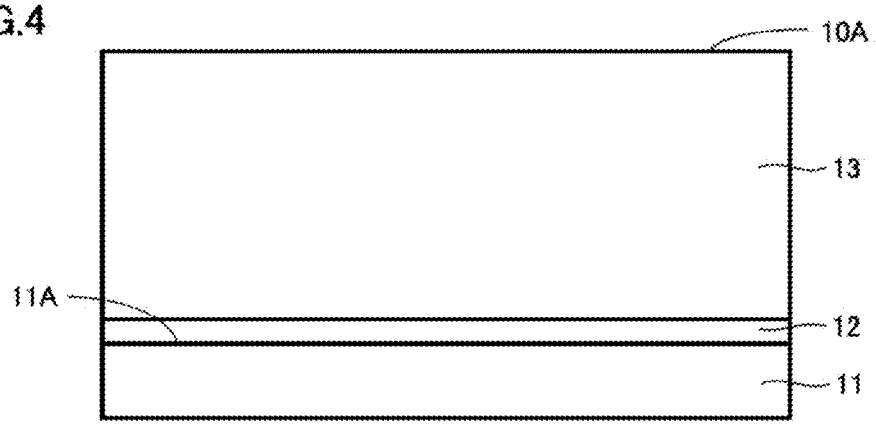
FIG. 4 is a schematic cross-sectional view for illustrating the method of manufacturing a semiconductor device according to the first embodiment.

Initially, in the step (S11), referring to FIG. 4, base substrate 11 composed of single crystal silicon carbide is prepared by cutting an ingot (not shown) composed of 4H—SiC. Then, in the step (S12), buffer layer 12 and drift layer 13 composed of silicon carbide are successively formed on one main surface 11A of base substrate 11 through epitaxial growth.

Figure 5:
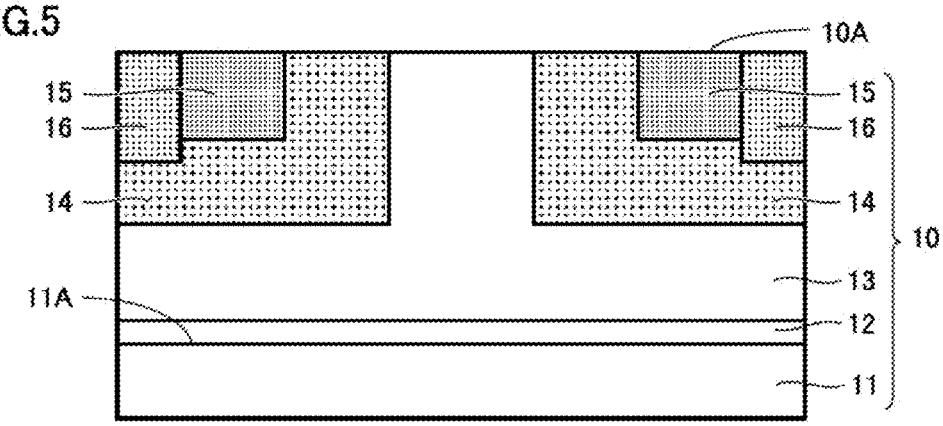
FIG. 5 is a schematic cross-sectional view for illustrating the method of manufacturing a semiconductor device according to the first embodiment.

Then, in the step (S13), referring to FIG. 5, initially, ions are implanted for forming body region 14. Specifically, body region 14 is formed, for example, by implanting Al (aluminum) ions into drift layer 13. Then, ions are implanted for forming source region 15. Specifically, source region 15 is formed in body region 14, for example, by implanting P (phosphorus) ions into body region 14. Furthermore, ions are implanted for forming contact region 16. Specifically, contact region 16 is formed in body region 14, for example, by implanting Al ions into body region 14. Ions can be implanted, for example, by forming on drift layer 13, a mask layer composed of silicon dioxide and having an opening in a desired region into which ions should be implanted.

Thus, silicon carbide substrate 10 including base substrate 11 having the n conductivity type and composed of silicon carbide, buffer layer 12 composed of silicon carbide and having the n conductivity type, drift layer 13 composed of silicon carbide and having the n conductivity type, body region 14 having the p conductivity type, source region 15 having the n conductivity type, and contact region 16 having the p conductivity type is prepared. Main surface 10A of silicon carbide substrate 10 may be, for example, a surface having an off angle not smaller than 0.1° and not greater than 8° with respect to the {0001} plane or may be a surface having an off angle not smaller than 1° and not greater than 8°.

Then, in a step (S20), an activation annealing step is performed. In this step (S20), silicon carbide substrate 10 is heated, for example, in an atmosphere of an inert gas such as argon. Thus, an impurity implanted in the step (S13) is activated.

Figure 6:
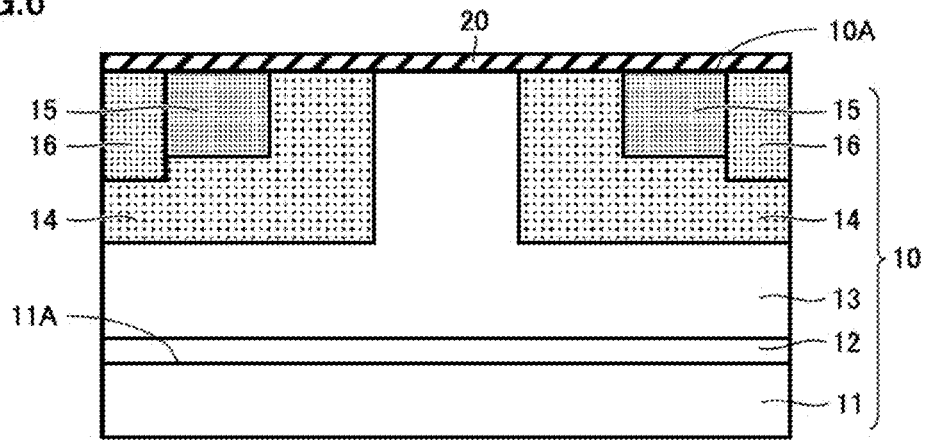
FIG. 6 is a schematic cross-sectional view for illustrating the method of manufacturing a semiconductor device according to the first embodiment.

Then, in a step (530), a gate oxide film formation step is performed. In this step (530), silicon carbide substrate 10 is heated in an atmospheric gas containing, for example, oxygen, at a temperature not lower than 1100° C. and not higher than 1400° C. (dry oxidation). Thus, as shown in FIG. 6, gate oxide film 20 composed of silicon dioxide is formed on main surface 10A of silicon carbide substrate 10 as being in contact therewith.

Then, in a step (S40), a nitrogen annealing step is performed. In this step (S40), silicon carbide substrate 10 is heated in an atmospheric gas such as nitrogen monoxide (NO) at a temperature not lower than 1100° C. and not higher than 1400° C. Thus, nitrogen atoms are trapped in a trap (not shown) present in an interface region between gate oxide film 20 and silicon carbide substrate 10, and consequently, formation of an interface state in the interface region is suppressed. Thereafter, silicon carbide substrate 10 is further heated in an atmospheric gas such as nitrogen ($N_2$) at a temperature not lower than 1100° C. and not higher than 1400° C. (post oxidation annealing (POA) treatment).

Figure 7:
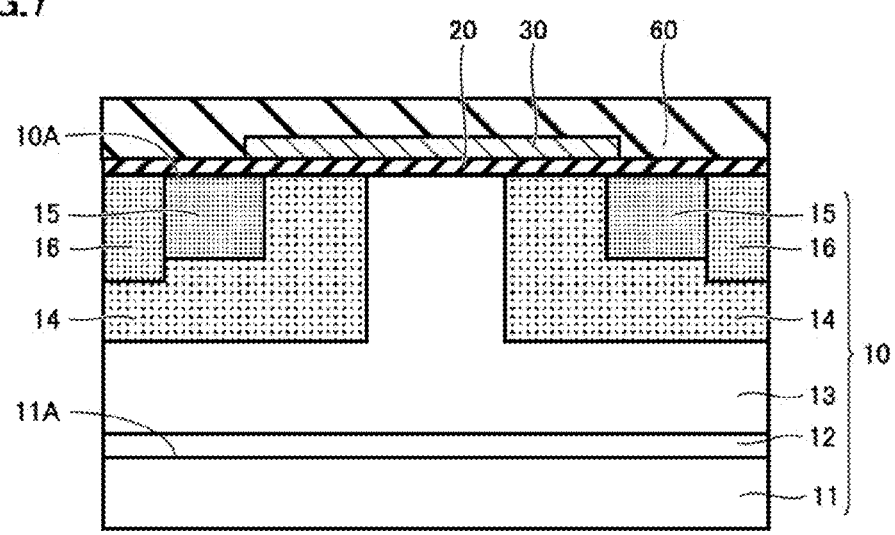
FIG. 7 is a schematic cross-sectional view for illustrating the method of manufacturing a semiconductor device according to the first embodiment.

Then, in a step (S50), a gate electrode formation step is performed. In this step (S50), referring to FIG. 7, for example with low pressure (LP)-chemical vapor deposition (CVD), gate electrode 30 composed of polysilicon to which an impurity has been added to a high density is formed on gate oxide film 20 as being in contact therewith.

Then, in a step (S60), an interlayer insulating film formation step is performed. In this step (S60), referring to FIG. 7, for example, with CVD, interlayer insulating film 60 composed of silicon dioxide or silicon nitride (having a film thickness not smaller than 0.5 μm and not greater than 2.0 μm) is formed to surround gate electrode 30 together with gate oxide film 20.

Figure 8:
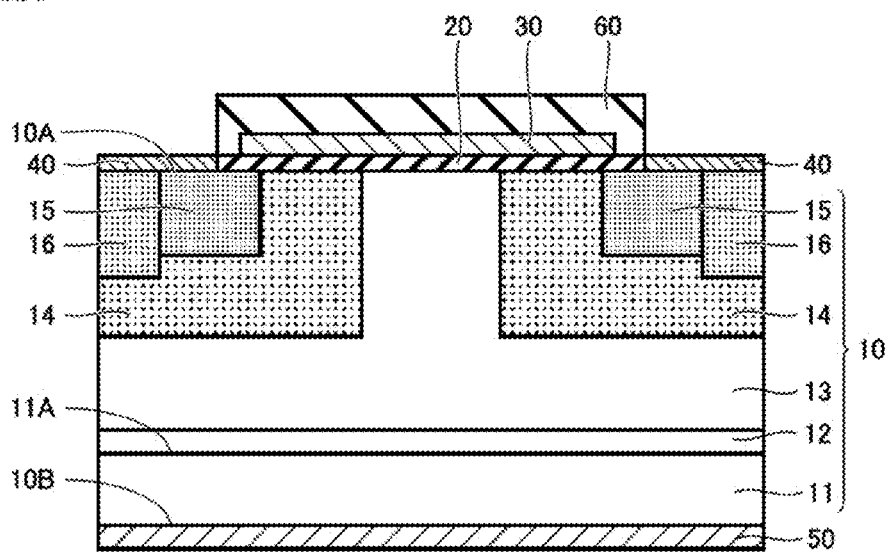
FIG. 8 is a schematic cross-sectional view for illustrating the method of manufacturing a semiconductor device according to the first embodiment.

Then, in a step (S70), an ohmic electrode formation step is performed. In this step (S70), referring to FIG. 8, initially, in a region where source electrode 40 is to be formed, interlayer insulating film 60 and gate oxide film 20 are removed and a region where source region 15 and contact region 16 are exposed is formed. Then, in that region, a metal film which is, for example, a stack film or a mixed film of Ti, Al, and Si or a stack film or a mixed film of Ni and Si is formed. Specifically, the metal film is formed in the region through patterning using lift-off or dry etching. The metal film is similarly formed also on main surface 10B of silicon carbide substrate 10 opposite to main surface 10A. Thereafter, silicon carbide substrate 10 is held at a temperature not lower than 850° C. and not higher than 1100° C. for a time period not shorter than 0.5 minute and not longer than 15 minutes in an atmosphere of such an inert gas as nitrogen or argon. By thus annealing the metal film, the metal film is alloyed and at least a part of the metal film is converted to silicide. Consequently, source electrode 40 and drain electrode 50 composed of a TiAlSi alloy or an NiSi alloy are formed.

Then, in a step (S80), a source interconnection formation step is performed. In this step (S80), referring to FIG. 1, source interconnection 41 composed of Al representing a conductor is formed, for example, with vapor deposition so as to cover interlayer insulating film 60 and source electrode 40. By performing the steps (S10) to (S80) above, MOSFET 1 according to the present embodiment is manufactured and the method of manufacturing a semiconductor device according to the present embodiment is completed.

Second Embodiment

A MOSFET 2 as a semiconductor device according to a second embodiment representing another embodiment of the present invention will now be described. MOSFET 2 according to the present embodiment is basically similar to MOSFET 1 in construction, operation, and effects, however, MOSFET 2 according to the present embodiment is different in structure from MOSFET 1 in that MOSFET 1 is a planar MOSFET whereas MOSFET 2 is a trench MOSFET.

Figure 9:
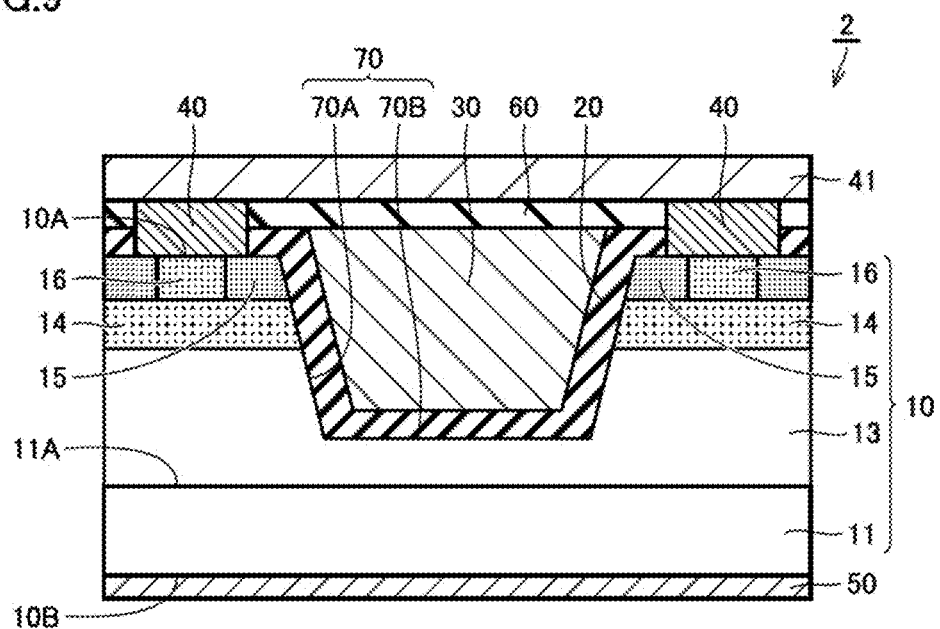
FIG. 9 is a schematic cross-sectional view showing a structure of a MOSFET according to a second embodiment.

Referring to FIG. 9, MOSFET 2 is a trench MOSFET, and mainly includes silicon carbide substrate 10, gate oxide film 20, gate electrode 30, source electrode 40 and drain electrode 50 serving as ohmic electrodes, interlayer insulating film 60, and source interconnection 41, similarly to MOSFET 1 according to the first embodiment. Silicon carbide substrate 10 has a trench 70 formed, which opens toward main surface 10A. Trench 70 includes a sidewall surface 70A and a bottom surface 70B, and formed such that sidewall surface 70A penetrate source region 15 and body region 14 so as to lie over source region 15, body region 14, and drift layer 13 and bottom surface 70B is located in drift layer 13. Main surface 10A has an off angle, for example, not smaller than 0.1° and not greater than 8° or preferably not smaller than 1° and not greater than 8° with respect to the {0001} plane.

Body region 14 is formed opposite to base substrate 11 when viewed from drift layer 13. Body region 14 is formed to include sidewall surface 70A and to extend in a direction away from sidewall surface 70A while it is in contact with drift layer 13. Body region 14 has the p conductivity type by containing a p-type impurity. A p-type impurity contained in body region 14 is exemplified by aluminum (Al) or boron (B).

Source region 15 is formed opposite to drift layer 13 when viewed from body region 14. Source region 15 is formed to include sidewall surface 70A and extend in a direction away from sidewall surface 70A while it is in contact with body region 14. Source region 15 has the n conductivity type by containing an n-type impurity. A value for a concentration of an n-type impurity contained in source region 15 is higher than a value for a concentration of an n-type impurity contained in drift layer 13. An n-type impurity contained in source region 15 is exemplified by phosphorus (P).

Contact region 16 is formed adjacent to source region 15 while it is in contact with body region 14. Contact region 16 has the p conductivity type by containing a p-type impurity. A value for a concentration of a p-type impurity contained in contact region 16 is higher than a value for a concentration of a p-type impurity contained in body region 14. A p-type impurity contained in contact region 16 is exemplified by Al or B, similarly to the p-type impurity contained in body region 14.

Gate oxide film 20 is formed in contact with silicon carbide substrate 10, and specifically, formed to cover sidewall surface 70A and bottom surface 70B of trench 70 and main surface 10A of silicon carbide substrate 10. Gate oxide film 20 is composed, for example, of silicon dioxide.

Gate electrode 30 is formed in contact with gate oxide film 20 such that gate oxide film 20 lies between gate electrode 30 and silicon carbide substrate 10, and specifically, formed to fill trench 70. Gate electrode 30 is composed, for example, of polysilicon to which an impurity has been added or such a conductor as Al.

Source electrode 40 is formed on main surface 10A of silicon carbide substrate 10 (on source region 15 and contact region 16) as being in contact therewith. Source electrode 40 is composed of a TiAlSi alloy or an NiSi alloy as in the first embodiment.

Interlayer insulating film 60 is formed to surround gate electrode 30 together with gate oxide film 20, and electrically isolates gate electrode 30 from source electrode 40 and source interconnection 41. Interlayer insulating film 60 is composed, for example, of silicon dioxide or silicon nitride.

Source interconnection 41 is formed to cover interlayer insulating film 60 and source electrode 40. Source interconnection 41 is composed, for example, of such a conductor as Al, and electrically connected to source region 15 through source electrode 40.

Drain electrode 50 is formed on main surface 10B of silicon carbide substrate 10 opposite to main surface 10A as being in contact therewith. Drain electrode 50 is composed of a material which allows ohmic contact with silicon carbide substrate 10, such as a material the same as that for source electrode 40, and electrically connected to silicon carbide substrate 10.

A contact interface between source electrode 40 and silicon carbide substrate 10 and a contact interface between drain electrode 50 and silicon carbide substrate 10 are constructed as in the first embodiment (see FIG. 2). Thus, MOSFET 2 achieves suppressed variation in threshold voltage as in MOSFET 1 according to the first embodiment.

Third Embodiment

Figure 10:
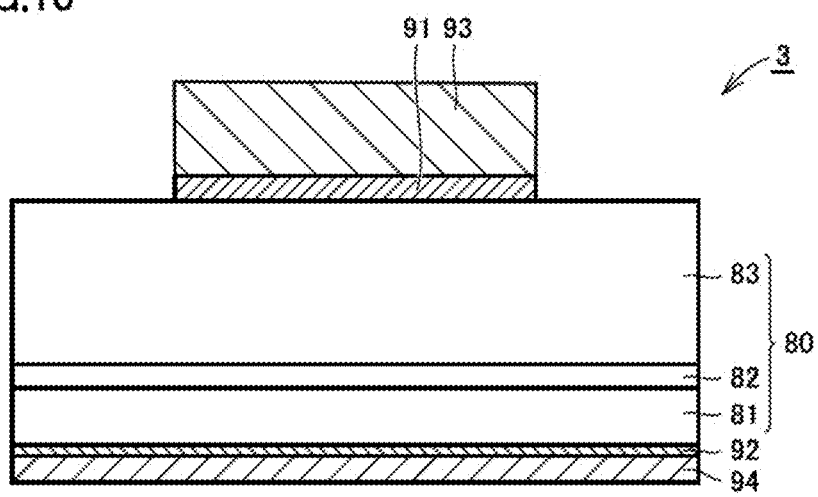
FIG. 10 is a schematic cross-sectional view showing a structure of an SBD according to a third embodiment.

A structure of a Schottky barrier diode (SBD) as a semiconductor device according to a third embodiment representing yet another embodiment of the present invention will now be described. Referring to FIG. 10, SBD 3 mainly includes a silicon carbide substrate 80, a Schottky electrode 91, an ohmic electrode 92, an interconnection 93, and a pad electrode 94.

Silicon carbide substrate 80 includes a base substrate 81, a buffer layer 82, and a semiconductor layer 83. Base substrate 81 is composed of silicon carbide, and has the n conductivity type by containing such an n-type impurity as nitrogen. Buffer layer 82 is formed on a main surface of base substrate 81 through epitaxial growth. Buffer layer 82 has the n conductivity type similarly to base substrate 81. Semiconductor layer 83 is formed on a main surface of buffer layer 82 opposite to base substrate 81. Semiconductor layer 83 has the n conductivity type similarly to base substrate 81 and buffer layer 82.

Schottky electrode 91 is formed on a main surface of silicon carbide substrate 80 as being in contact therewith. For a metal forming Schottky electrode 91, for example, at least one metal selected from the group consisting of titanium (Ti), tungsten (W), molybdenum (Mo), nickel (Ni), tantalum (Ta), and gold (Au) as a metal which allows Schottky contact with silicon carbide substrate 80 can be adopted. Interconnection 93 is composed of such a conductor as Al and formed on Schottky electrode 91.

Ohmic electrode 92 is formed on a main surface of silicon carbide substrate 80 opposite to Schottky electrode 91, as being in contact therewith. Ohmic electrode 92 is composed of a TiAlSi alloy or an NiSi ally and in ohmic contact with silicon carbide substrate 80 as in the first and second embodiments. Pad electrode 94 is composed of such a conductor as Al and formed on ohmic electrode 92. A contact interface between ohmic electrode 92 and silicon carbide substrate 80 is constructed as in the first and second embodiments (see FIG. 2). Thus, SBD 3 achieves suppressed variation in electrical characteristics due to a state of contact between ohmic electrode 92 and silicon carbide substrate 80 as in the first and second embodiments.

Though a MOSFET or an SBD has been described in the first to third embodiments by way of example of a semiconductor device according to the present invention, the semiconductor device according to the present invention is not limited as such. Namely, the semiconductor device according to the present invention may be, for example, a junction field effect transistor (JFET), an insulated gate bipolar transistor (IGBT), or a P-intrinsic-N (PIN) diode, and the structure as shown in FIG. 2 may be formed at a contact interface between an ohmic electrode and a silicon carbide substrate of such a semiconductor device. Thus, variation in electrical characteristics caused by a state of contact between an ohmic electrode and a silicon carbide substrate can be suppressed also in these semiconductor devices as in a MOSFET or an SBD.

EXAMPLES

Figure 11:
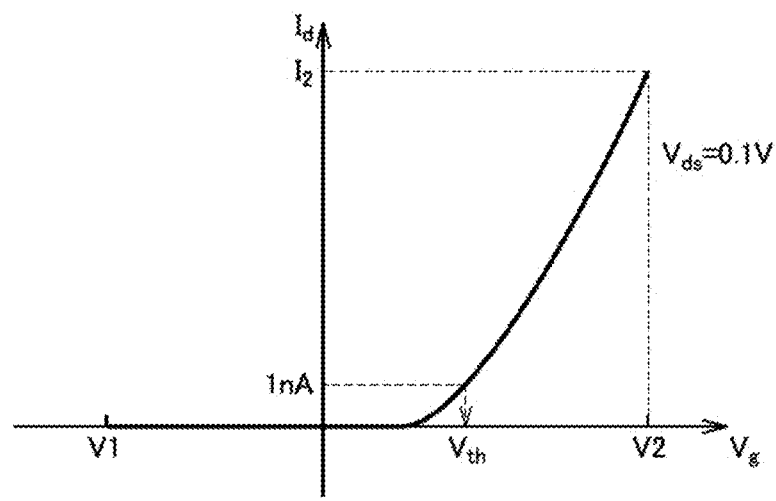
FIG. 11 is a diagram showing relation between a gate voltage and a drain current.
Figure 12:
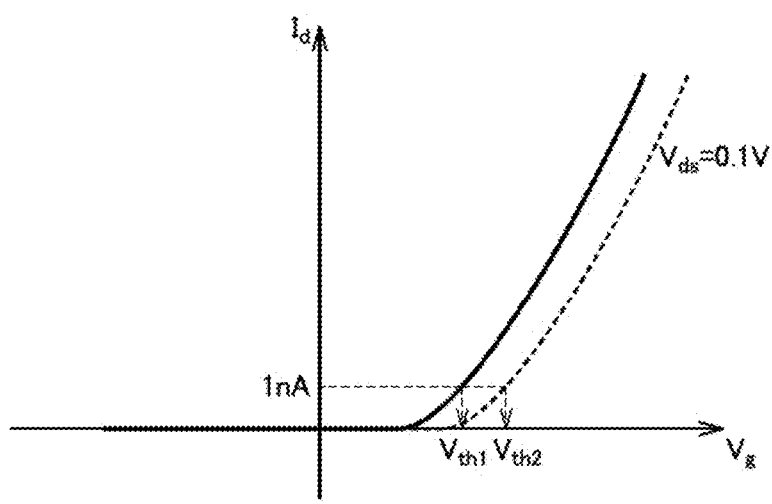
FIG. 12 is a diagram showing relation between a gate voltage and a drain current.

An experiment for confirming an effect to suppress variation in threshold voltage according to the present invention was conducted. Initially, MOSFET 1 according to the first embodiment was prepared (Example, see FIG. 1). Then, a threshold voltage ($V_{th1}$) of MOSFET 1 before application of a voltage was measured. Then, a voltage of −15V was applied to gate electrode 30 for a prescribed period of time while a voltage of source electrode 40 is 0 V and a voltage of drain electrode 50 is 0 V, a threshold voltage ($V_{th2}$) was measured again every application time period, and variation in value for a threshold voltage ($\Delta V_{th}=V_{th1}-V_{th2}$) was calculated from a result of measurement. Here, the threshold voltage ($V_{th}$) is as described with reference to FIGS. 11 and 12. As Comparative Example, a MOSFET in which base surface 10C was not exposed at a contact interface of silicon carbide substrate 10 with source electrode 40 (a MOSFET not having the structure shown in FIG. 2) was prepared and an experiment the same as above was conducted. The MOSFETs in Example and Comparative Example were cut in a direction of thickness, and a structure of the contact interface between source electrode 40 and silicon carbide substrate 10 was analyzed with EDX, BF-STEM, and HAADF-STEM.

Figure 13:
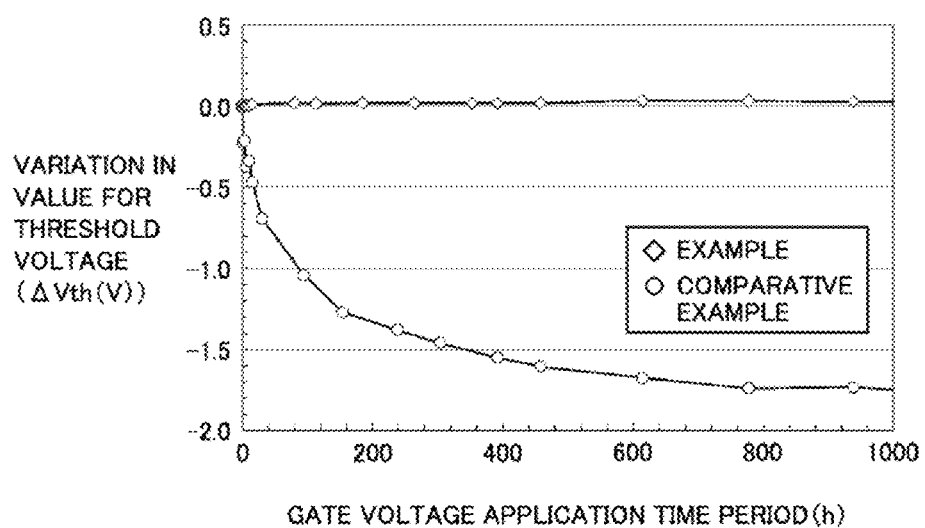
FIG. 13 is a diagram showing relation between a time period of application of a gate voltage and variation in threshold voltage.
Figure 14:
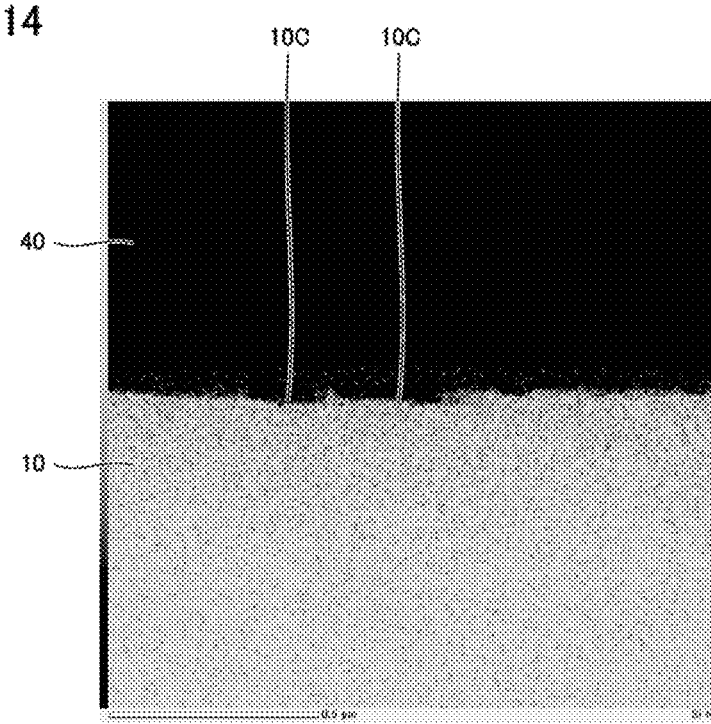
FIG. 14 is a mapping chart of a silicon element with EDX in a MOSFET in Example.
Figure 15:
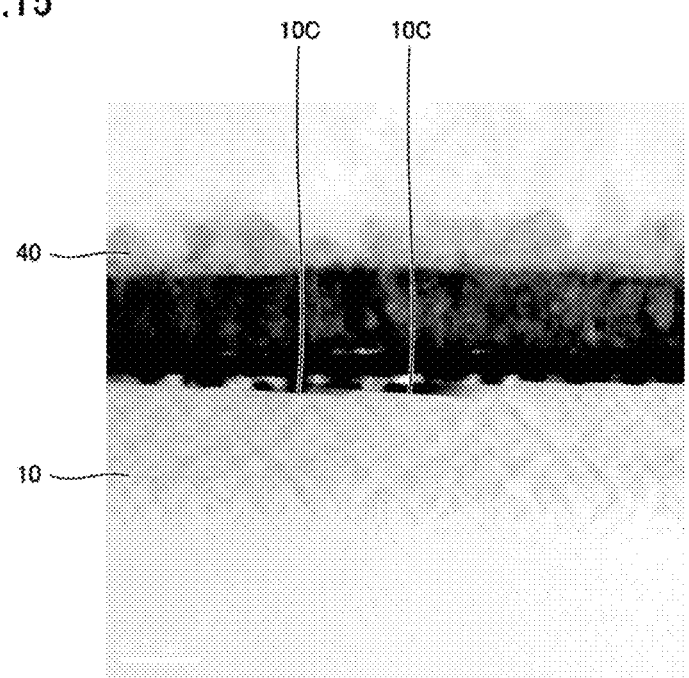
FIG. 15 is a BF-STEM photograph of the MOSFET in Example.
Figure 16:
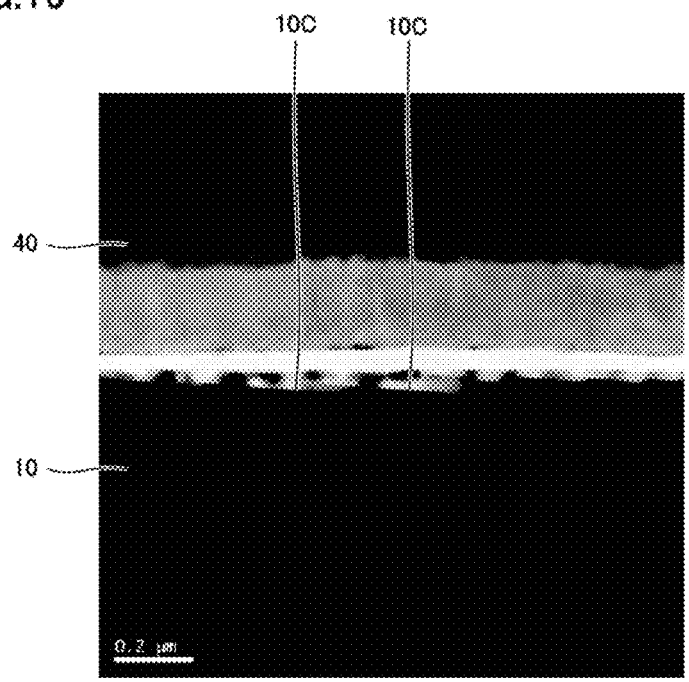
FIG. 16 is a HAADF-STEM photograph of the MOSFET in Example.
Figure 17:
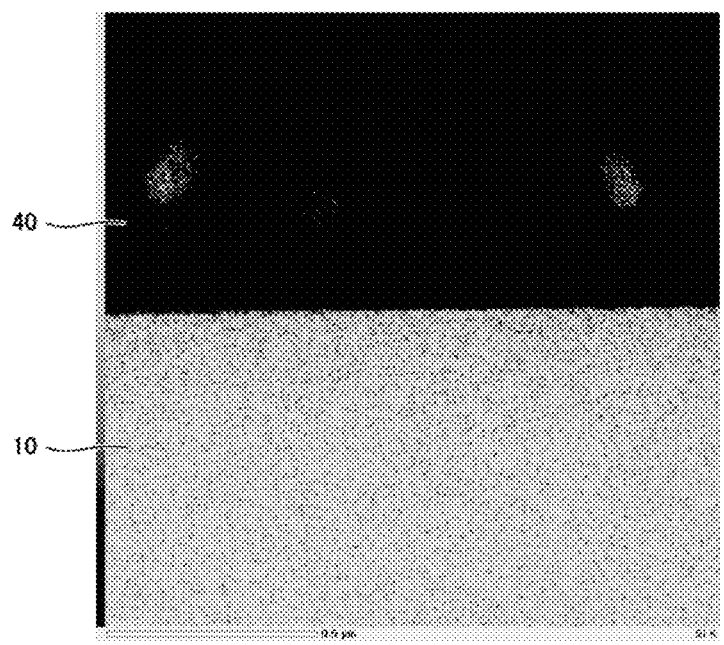
FIG. 17 is a mapping chart of a silicon element with EDX in the MOSFET in Example.
Figure 18:
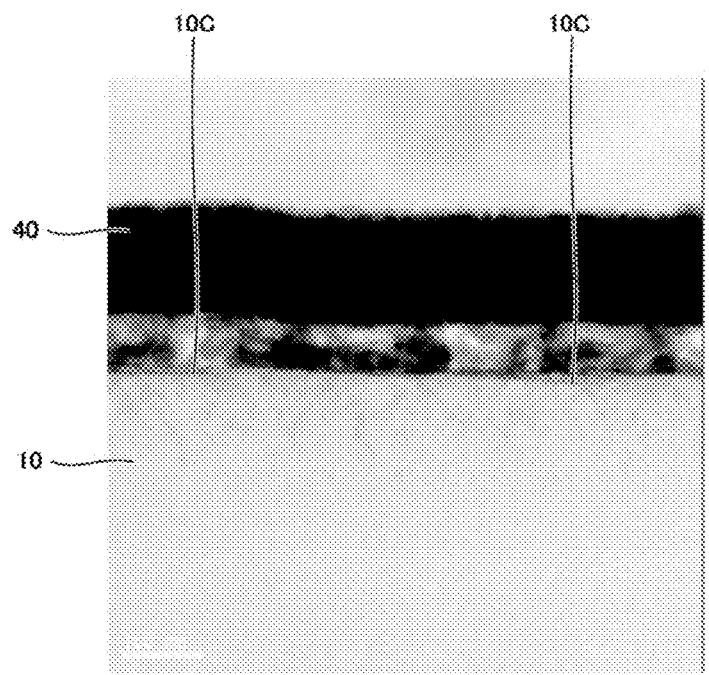
FIG. 18 is a BF-STEM photograph of the MOSFET in Example.
Figure 19:
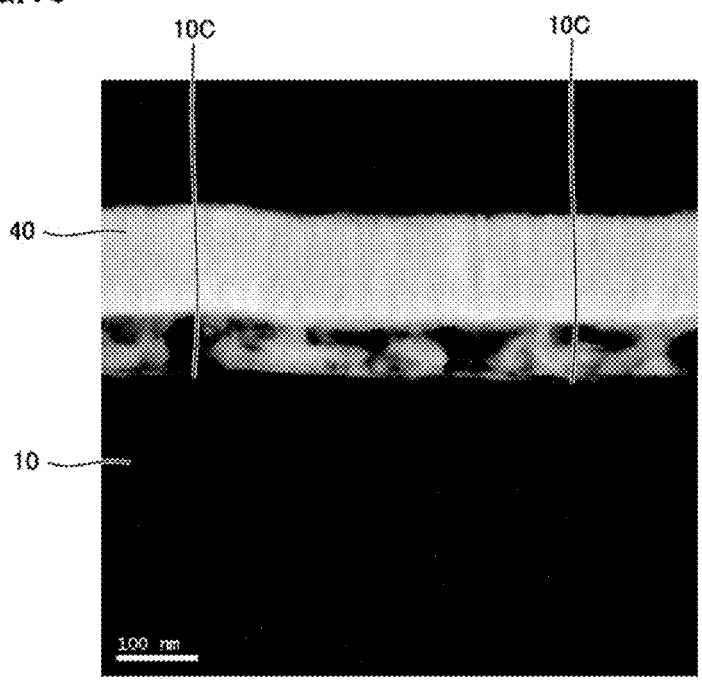
FIG. 19 is a HAADF-STEM photograph of the MOSFET in Example.

FIG. 13 shows a result of calculation of variation in value for a threshold voltage ($\Delta V_{th}$) every time period of application of a gate voltage. In FIG. 13, the abscissa represents a gate voltage application time period (h), and the ordinate represents variation in value for a threshold voltage ($\Delta V_{th}$ (V)). As is clear from FIG. 13, in Example, a value for $\Delta V_{th}$ (an absolute value) significantly lowered as compared with the value in Comparative Example. It was found from this result that variation in threshold voltage could sufficiently be suppressed according to the semiconductor device in the present invention.

Figure 20:
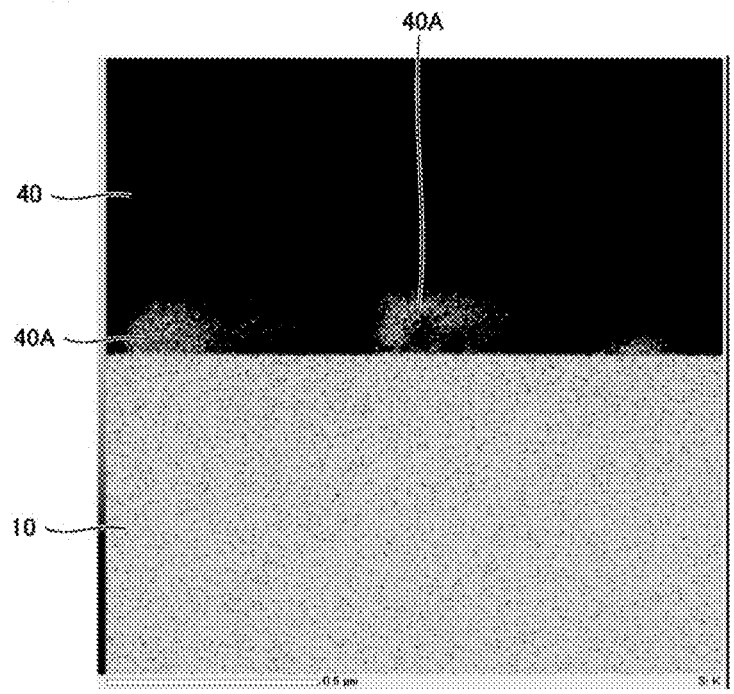
FIG. 20 is a mapping chart of a silicon element with EDX in a MOSFET in Comparative Example before application of a voltage.
Figure 21:
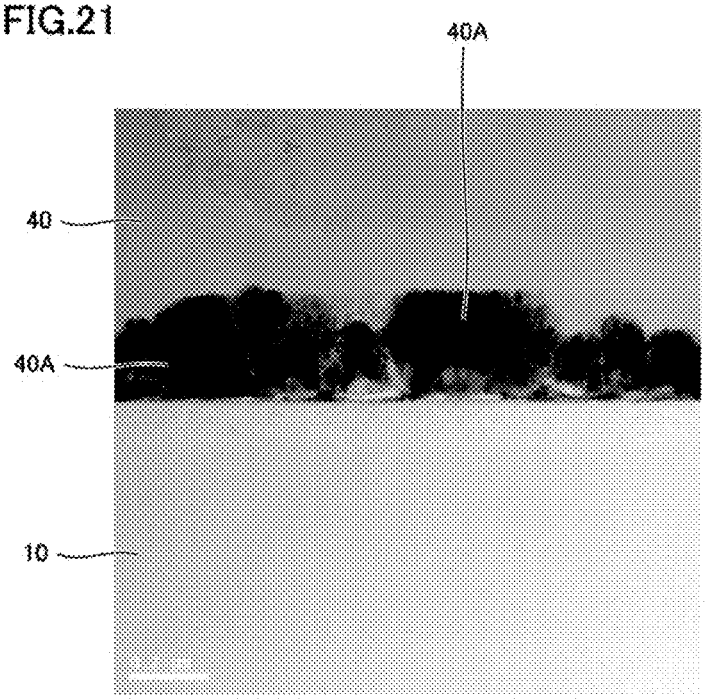
FIG. 21 is a BF-STEM photograph of the MOSFET in Comparative Example before application of a voltage.
Figure 22:
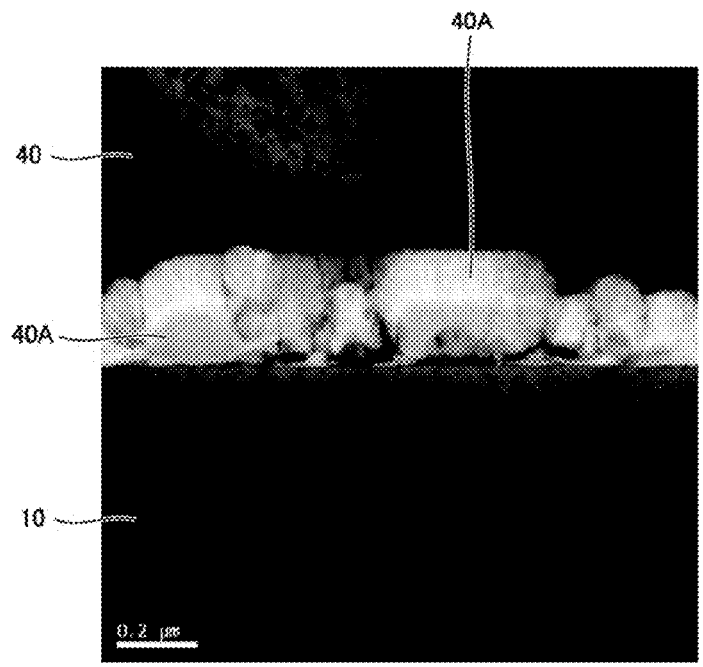
FIG. 22 is a HAADF-STEM photograph of the MOSFET in Comparative Example before application of a voltage.
Figure 23:
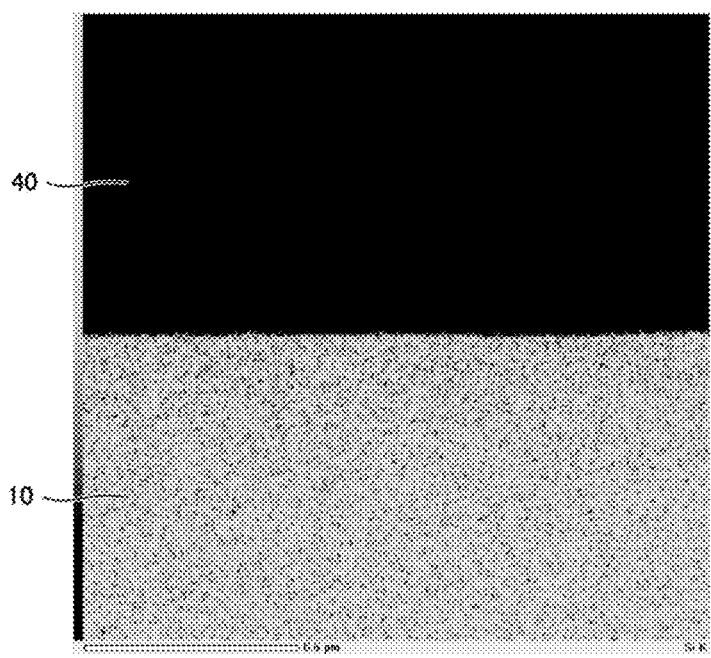
FIG. 23 is a mapping chart of a silicon element with EDX in the MOSFET in Comparative Example after application of a voltage.
Figure 24:
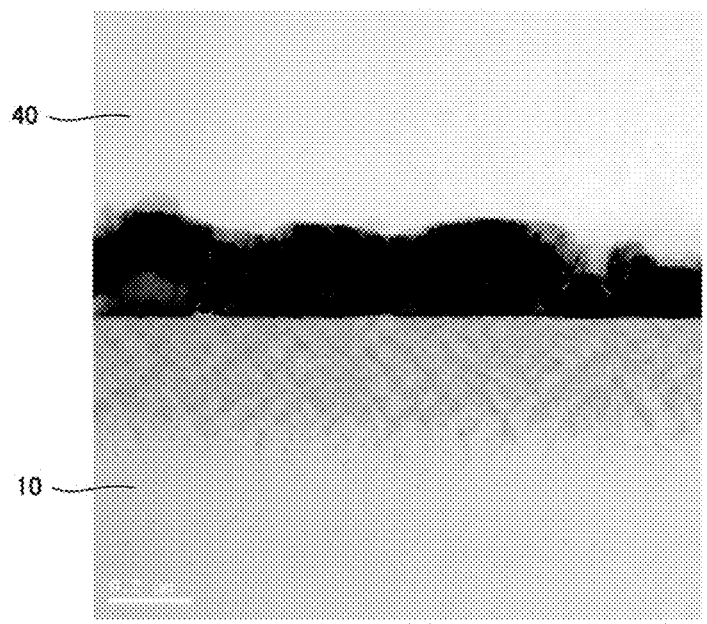
FIG. 24 is a BF-STEM photograph of the MOSFET in Comparative Example after application of a voltage
Figure 25:
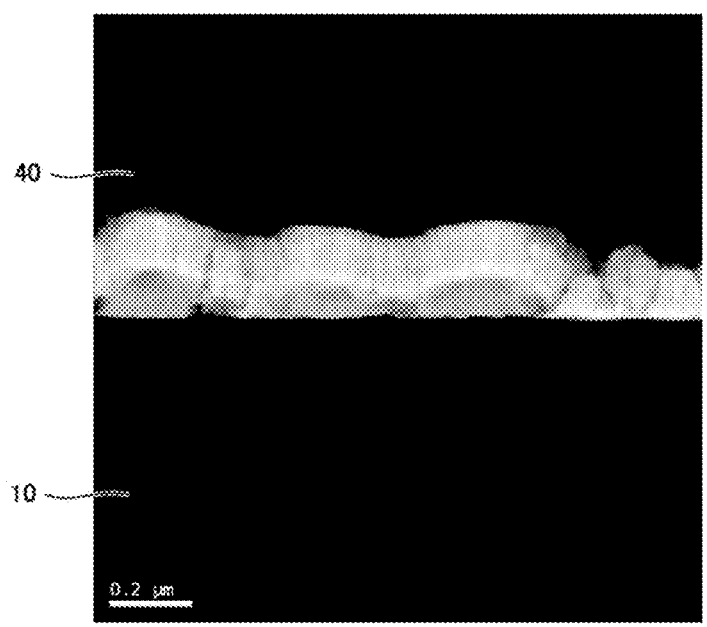
FIG. 25 is a HAADF-STEM photograph of the MOSFET in Comparative Example after application of a voltage.

Relation between variation in threshold voltage and a structure at a contact interface was then examined. FIGS. 14 to 19 show Si mapping charts with EDX (see FIGS. 14 and 17), BF-STEM photographs (see FIGS. 15 and 18), and HAADF-STEM photographs (see FIGS. 16 and 19) at the contact interface between source electrode 40 and silicon carbide substrate 10 in Example. FIGS. 20 to 22 show an Si mapping chart with EDX (see FIG. 20), a BF-STEM photograph (see FIG. 21), and an HAADF-STEM photograph (see FIG. 22) at the contact interface in Comparative Example before application of a voltage, respectively. FIGS. 23 to 25 show an Si mapping chart with EDX (see FIG. 23), a BF-STEM photograph (see FIG. 24), and an HAADF-STEM photograph (see FIG. 25) at the contact interface in Comparative Example after application of a voltage, respectively. Magnification in FIGS. 14 to 16 and FIGS. 20 to 25 was set to 100000, and magnification in FIGS. 17 to 19 was set to 200000. In the mapping chart with EDX, a white region where a silicon element is dense is observed.

In Comparative Example before application of a voltage, a clumpy object 40A of silicon (Si) was observed around the contact interface as shown in FIGS. 20 to 22, whereas in Comparative Example after application of a voltage, no clumpy object 40A was observed as shown in FIGS. 23 to 25. As shown in FIGS. 14 to 19, in the MOSFET in Example, no clumpy object 40A was observed but a state that base surface 10C was exposed at the contact interface of silicon carbide substrate 10 with source electrode 40 was observed. When height H of base surface 10C (see FIG. 2) was observed, heights of 64.5 nm and 28.7 nm (see FIG. 15) and 10.3 nm and 15.0 nm (see FIG. 18) were observed. It was found from this result that change in state of distribution of a silicon element at the contact interface before and after application of a voltage was considered as the cause of variation in threshold voltage. In addition, it was found that variation in threshold voltage was mitigated when a more stable structure in which base surface 10C was exposed at the contact interface of silicon carbide substrate 10 with source electrode 40 was obtained.

It should be understood that the embodiments and the example disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The semiconductor device according to the present invention can particularly advantageously be applied to a semiconductor device required to achieve suppressed variation in electrical characteristics.

REFERENCE SIGNS LIST

1, 2 MOSFET; 3 SBD; 10, 80 silicon carbide substrate; 10A, 10B, 11A main surface; 10C base surface; 11, 81 base substrate; 12, 82 buffer layer; 13 drift layer; 14 p-type body region; 15 source region; 16 contact region; 20 gate oxide film; 30 gate electrode, 40 source electrode; 40A clumpy object; 41 source interconnection; 50 drain electrode; 60 interlayer insulating film; 70 trench; 70A sidewall surface; 70B bottom surface; 83 semiconductor layer; 91 Schottky electrode; 92 ohmic electrode; 93 interconnection; 94 pad electrode; H height; and L length.

The invention claimed is:

1. A semiconductor device, comprising:
   a silicon carbide substrate including a main surface having an off angle with respect to a {0001} plane; and
   an ohmic electrode formed in contact with said main surface,
   a base surface being exposed at least a part of a contact interface of said silicon carbide substrate with said ohmic electrode, and
   wherein a length of said base surface in a direction of the off angle is not smaller than 36 nm and not greater than 430 nm.

2. The semiconductor device according to claim 1, wherein
   said ohmic electrode contains at least one metal of Ni, Ti, and Al.

3. The semiconductor device according to claim 2, wherein
   said ohmic electrode is composed of a TiAlSi alloy or an NiSi alloy.

4. The semiconductor device according to claim 1, further comprising:
   an oxide film formed in contact with said silicon carbide substrate;
   a gate electrode formed in contact with said oxide film such that said oxide film lies between the gate electrode and said silicon carbide substrate; and
   a drain electrode formed in contact with said silicon carbide substrate, wherein
   said ohmic electrode is a source electrode,
   said source electrode and said drain electrode are configured such that a current which flows between said source electrode and said drain electrode can be controlled with a gate voltage applied to said gate electrode,
   a difference between a first threshold voltage of said semiconductor device which is measured first and a second threshold voltage of said semiconductor device which is measured after application of stress to said semiconductor device continuously for 1000 hours is within ±0.2 V, and
   application of said stress means application of said gate voltage of −15 V to said gate electrode while a voltage of said source electrode is 0 V and a voltage of said drain electrode is 0 V.

* * * * *